United States Patent [19]

Nakagawa

[11] Patent Number: 5,447,595

[45] Date of Patent: Sep. 5, 1995

[54] ELECTRODES FOR PLASMA ETCHING APPARATUS AND PLASMA ETCHING APPARATUS USING THE SAME

[75] Inventor: Satoshi Nakagawa, Nagaokakyo, Japan

[73] Assignee: Matsushita Electronics Corporation, Osaka, Japan

[21] Appl. No.: 20,137

[22] Filed: Feb. 19, 1993

[30] Foreign Application Priority Data

Feb. 20, 1992 [JP] Japan .................................. 4-033074

[51] Int. Cl.⁶ .......................................... H01L 21/00
[52] U.S. Cl. .................. 156/345; 118/723 E; 118/728; 204/298.31; 216/67
[58] Field of Search ............................ 156/345, 643; 118/723 E, 723 ER, 724, 725, 728; 204/298.31

[56] References Cited

U.S. PATENT DOCUMENTS

| | | | |
|---|---|---|---|
| 4,793,975 | 12/1988 | Drage | 156/345 X |
| 4,832,781 | 5/1989 | Mears | 156/345 X |
| 4,873,942 | 10/1989 | Engle | 118/728 |
| 4,897,171 | 1/1990 | Ohmi | 156/345 X |
| 5,085,750 | 2/1992 | Soraoka et al. | 156/345 X |

FOREIGN PATENT DOCUMENTS 63-58920 3/1988 Japan .
1-312088 12/1989 Japan .
2-240922 9/1990 Japan .
4-239130 8/1992 Japan .
5-25647 2/1993 Japan .

*Primary Examiner*—R. Bruce Breneman
*Assistant Examiner*—Jonathan D. Baskin
*Attorney, Agent, or Firm*—Rogers & Wells

[57] ABSTRACT

A bottom electrode is of a double-layered structure composed of an aluminum portion and an anode oxide film. A surface of the aluminum portion is finished to a surface roughness of 1 μm or less by polishing, for example, and the anode oxide film is grown by the anode oxidation technique. A surface of the anode oxide film is finished to a surface roughness of 1 μm or less by polishing, for example. The polishing may be carried out by wrapping technique using diamond abrasive. The substrate slightly charged with descending cathode of plasma is weakly absorbed onto the bottom electrode, because the insulating film having a high degree of surface smoothness is interposed between the substrate and the bottom electrode. A large contact area and improved heat transfer are assured even with weak electrostatic absorption, thanks to excellent smoothness of the surface of the electrode. It is possible to control the temperature of the substrate without complicated mechanism.

8 Claims, 3 Drawing Sheets

ELECTRODES FOR PLASMA ETCHING APPARATUS AND PLASMA ETCHING APPARATUS USING THE SAME

BACKGROUND OF THE INVENTION

1. Field of the Invention

This invention relates to electrodes for plasma etching apparatus using low temperature plasma technique and plasma etching apparatus using the same.

2. Description of the Related Prior Art

A conventional plasma etching apparatus is described with reference to the drawings, wherein FIG. 4(a) is a cross sectional structure view of the conventional plasma etching apparatus and FIG. 4(b) is an enlarged view of a circle 1 in FIG. 4(a). The atmosphere in an etching chamber 2 is discharged via an air outlet 3 into vacuum state. A bottom electrode platform 4 is made of insulating material. A bottom electrode 5 is mounted on the bottom electrode platform 3, which electrode holds thereon a substrate 6 to be etched. A top electrode 7 is designed to introduce an etching gas via a gas inlet 10 and guide the gas into the etching chamber 2 via gas distribution openings 11. Further, the bottom electrode 5 is electrically connected at a high frequency power supply node 8 to a high frequency power supply 9 and then grounded at 12. Plasm is generated between the etching chamber 2 and the top electrode 7. The bottom electrode 5 is cooled with a refrigerant 15 flowing from a refrigerant inlet 13 to a refrigerant outlet 14. The etching chamber 2 is also grounded at 16. As FIG. 4(b) indicates, the surface roughness of a surface of the bottom electrode 5 in the conventional apparatus is approximately 10 $\mu$m or more.

FIGS. 4(a) and 4(b) illustrates mere placement of the substrate on the bottom electrode 5. Another method of mounting the substrate on the bottom electrode is a clamping technique by which the surface of the substrate is pressed down and He gas is introduced from rear.

Still another technique consists of disposing an insulating film on a surface of the bottom electrode 5 and applying a high DC voltage to the bottom electrode 5, by which an electric charge is injected into the insulating film and electrostatic absorption caused by the electric charge helps the bottom electrode 5 secure and hold the substrate to be etched.

Those conventional techniques are, however, not satisfactory in that the smoothness of the surface of the bottom electrode 5 is so poor as to deteriorate heat transfer to the substrate and increase the temperature of the surface of the substrate during etching process to thereby cause instable etching performance.

It is likely that the clamping technique would suffer from problems of dirty or damaged substrate, because the surface of the substrate is pressed down physically. A proposed solution to the problem is either to form an anti-erosion oxide film on an aluminum electrode as suggested in Japanese Laid-open Publication 63-658920 or to cover an electrode for plasm etching or plasma CVD with a coating of small sputtering efficiency.

The electrostatic absorption technique causes the substrate to be electrostatically absorbed upon application of the DC voltage to the bottom electrode 5. However, if plasma process takes place under the circumstance, then difficulty would be experienced in removing the substrate from the bottom electrode 5 while remaining absorbed. In case it is forcibly removed, the substrate would be scratched or damaged. For this reason, an anode oxide film is proposed in Japanese Laid-open Publication 2-240922 which is formed on an aluminum electrode with a metal in bores in the anode oxide film. The proposed anode oxide film prevents the substrate from being secured or attached to the bottom electrode 5 after plasma process.

Those conventional techniques might be able to minimize the generation of dust or the deterioration of the bottom electrode 5, individually. Those techniques are, however, unsuccessful in preventing reliability and stability of etching performances from becoming deteriorated due to temperature rise during etching process or preventing dust from generating during manual operation at the same time.

In particular, the clamping technique is unable to solve the problem that the substrate would become bent due to the pressure of helium (He) gas when the substrate of a large size is used.

For the electrostatic absorption technique, it is necessary to apply a very high DC voltage. Thus, the requirement for the insulating material forming the surface of the bottom electrode 5 is that breakdown voltage be high and leak current be small. Many of insulating materials currently in use in the semiconductor industry, however, are easy to be eroded once they are subjected to the etching atmosphere. The plasma etching apparatus is less reliable.

The present invention is to provide a plasma etching apparatus which is simple in construction, stable in etching performance and high in reliability.

SUMMARY OF THE INVENTION

To solve the above discussed problems, the present invention provides an electrode for plasma etching apparatus which comprises an electric conductive portion having a surface roughness of less than 1 $\mu$m and an anode oxide film having a surface roughness of less than 1 $\mu$m, formed on the electric conductive portion by anode oxide of the electric conductive portion. A substrate to be etched is placed on the anode oxide film.

To solve the above discussed problems, the present invention in one of its aspects provides a plasma etching apparatus which comprises an electric conductive portion to which high frequency power is supplied, a lower electrode having an anode oxide film formed on the electric conductive portion by anode oxidation of the electric conductive portion, said anode oxide film holding thereon a substrate to be etched, and an upper electrode placed to face the lower electrode and grounded, wherein a refrigerant is introduced from beneath the lower electrode to cool the substrate, and wherein the substrate is electrostatically absorbed onto the lower electrode and the difference between the temperature of the refrigerant and the temperature of the substrate is kept constant below 20° C. when the high frequency power is supplied and etching process advances.

With the above arrangement of the present invention, the substrate is absorbed lightly due to a small charge caused with lowering of a cathode for plasma, because an insulating film having a high degree of surface smoothness is sandwiched between the substrate and the lower electrode. Thanks to a high degree of surface smoothness of the electrode surface, the contact area becomes large even with weak absorption and heat transfer is improved significantly. It is also made possible to carry out the temperature control of the substrate without resorting to a complex mechanism.

DESCRIPTION OF THE PREFERRED EMBODIMENTS

Figure 1A:
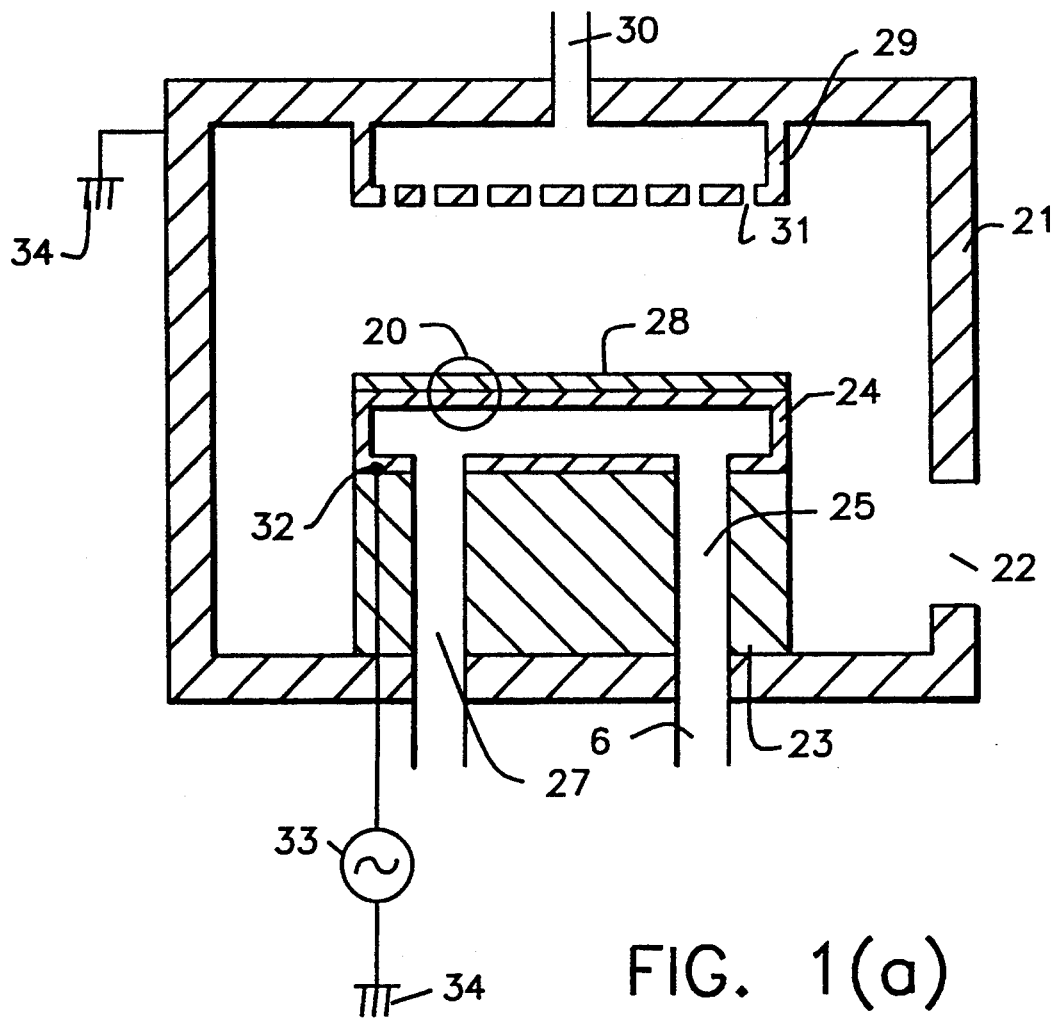
FIG. 1(a) is a cross sectional construction view of a plasma etching apparatus according to the present invention.
Figure 1B:
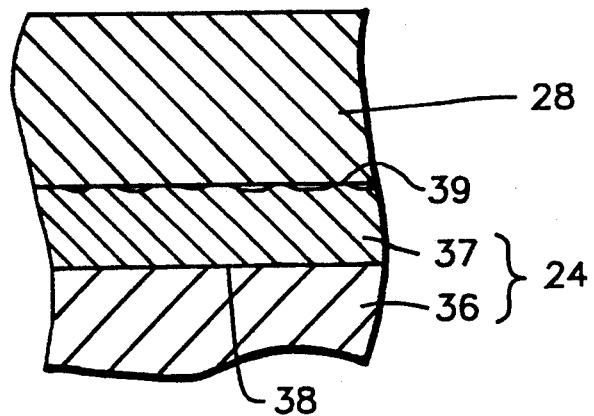
FIG. 1(b) is an enlarged view of a circle portion 20 in FIG. 1(a) showing a lower electrode and a substrate to be etched.

A plasma etching apparatus according to a first embodiment of present invention is described with reference to the drawings, wherein FIG. 1(a) is a cross sectional structure view of the plasma etching apparatus according to the present invention and FIG. 1(b) is an enlarged view of a circle 20 in FIG. 1(a). An etching chamber 21 is made of a metal material such as aluminum alloy. The atmosphere of the etching chamber 21 is discharged and withdrawn into vacuum state via an outlet 22. A bottom electrode platform 23 is installed at a bottom portion of the etching chamber 21. The bottom electrode platform 23 is made of a dielectric material such as alumina ceramic. A bottom electrode 24 having a hollow configuration inside is placed on the bottom electrode platform 23. A refrigerant 26 is injected into the hollow configuration via a refrigerant inlet 25. The coolant 26 is discharged from a refrigerant output 27 while cooling the bottom electrode 24. Repeated circulation of the refrigerant cools the bottom electrode 24 and prevents temperature rise. The refrigerant 26 travels inside the bottom electrode platform 23 and reaches the top electrode 24. Disposed at an upper level in the etching chamber 21 is a top electrode 29. The top electrode 29 is made of metal material such as aluminum alloy. A gas is introduced inside the top electrode 24 from a gas inlet 30 formed at the top of the etching chamber 21. The gas is then discharged into the interior of the etching chamber 21 via gas distribution openings 31 formed at the bottom of the top electrode 29. It is noted that the bottom electrode 24 is electrically connected to a high frequency power source 33 at a high frequency power supply node 32. One terminal of the high frequency power source 33 and the etching chamber 21 are grounded at 34 and maintained at ground potential. Upon applying high frequency power from the high frequency power source 33, a plasma is created inside the etching chamber 21 and between the top electrode 29 and the bottom electrode 24.

An enlarged view of a circle 20 is shown in FIG. 1(b). The bottom electrode 24 is of a double layered structure composed of an aluminum portion 36 and an anode oxide film 37 disposed on the aluminum portion 36. In the illustrated embodiment, a surface 38 of the aluminum portion 36 is finished to a surface roughness of 1 μm or less by polishing or other techniques and the anode oxide film is developed by anode oxidation process. Moreover, a surface 39 of the anode oxide film 37 is finished to a surface roughness of 1 μm or less by polishing, for example. A typical polishing method used here is a wrapping method using diamond abrasive.

The high frequency power is supplied to the aluminum portion of the double layered structure. On the other hand, the anode oxide film 37 in the double-layered structure provides electric isolation between the substrate 28 and the aluminum portion 36. Upon applying the high frequency power to the aluminum portion 36, a plasma is generated between the top electrode 29 and the bottom electrode 24. At this time, a sheath is formed in contact with the bottom electrode 24, which sheath is determined by the high frequency power supplied. A DC potential is substantially applied inside the region of the sheath. Once charge particles (ions, electrons and etc.) in the plasma have entered the sheath region, the charge particles would be accelerated. The DC potential is higher at the plasma region than the potential at the bottom electrode 24. As a result, the charge particles having a negative polarity impinge on the substrate 28 seated on the bottom electrode 24 so that the substrate 28 on the bottom electrode 24 is negative charged. Simultaneously with negative charging of the substrate 28, positive charges of the same amount as that of the negative charges are induced on the surface of the anode oxide film 37 beneath the substrate 28. In this manner, the substrate 28 is negative charged and the anode oxide film 37 is positive charged. An electrostatic force is developed between the both to absorb the substrate 28 onto the bottom electrode 24. In the illustrated embodiment, the thickness of the aluminum portion 36 is about 1 cm and the thickness of the anode oxide film 37 is about 60 μm. The thickness of the aluminum portion 36 is determined by the mechanical strength which is enough to tolerate during a sequence of etching steps, and design considerations.

The thickness of the anode oxide film 37, on the other hand, is determined by surface temperature. In other words, where the anode oxide film 37 is thicker, it may be maintained at a certain temperature even if the surface temperature of the substrate 28 is high. Provided, however, that the thickness of the anode oxide film 37 is 120 μm or more, cracks would be developed in the anode oxide film 37 or mother material would be molten during etching process with lowered reliability of etching process even if the state-of-art technique is employed. On the other hand, if the anode oxide film 37 is thinner, the film would experience temperature rise as does the substrate 28, with resultant fluctuations in the etching performances.

Usually, the temperature of the substrate 28 increases during plasma etching process. However, provided that the polishing to a surface roughness of 1 μm or less is effected, it is possible to control the surface temperature of the substrate very accurately.

Figure 2:
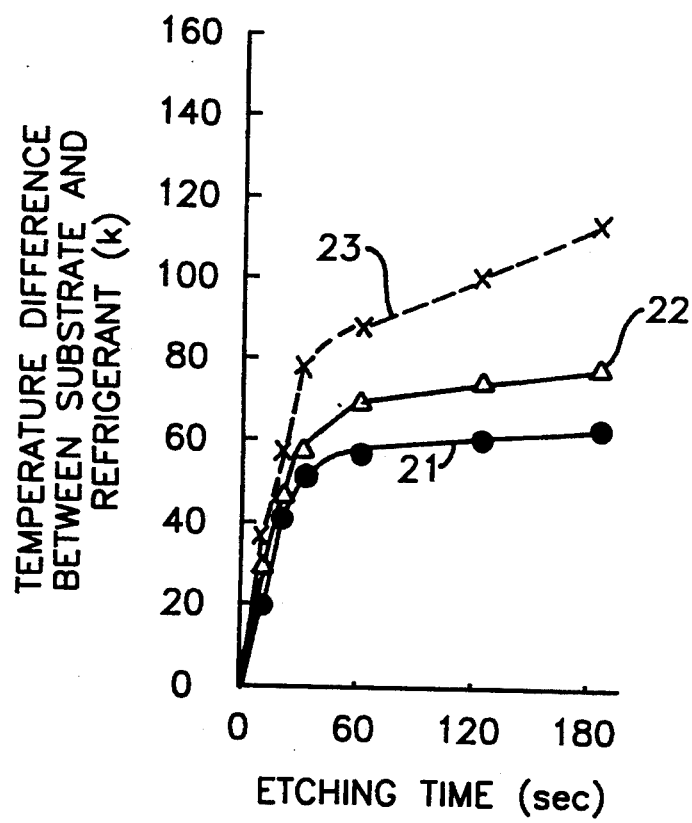
FIG. 2 is a chart showing the relationship between temperature difference between a refrigerant and substrate and etching time.

The temperature of the substrate 28 during etching process will be described in more detail with reference to the drawings. An optical fiber thermo-meter is used for temperature measurements of the substrate to be etched. The optical fiber thermo-meter used here is of the type wherein fluorescent material is placed at the tip of optical fiber and a laser pulse is applied to the fluorescent material and the time for the fluorescent material to produce fluorescence is measured. The temperature measurements take place on the basis of the fluorescence sensing time. FIG. 2 shows the temperature difference between the refrigerant 26 and the substrate 28 as a function of the etching time when an aluminum alloy film is etched. The etching process was carried out when 60 sccm of $BCl_3$ and 30 sccm of $Cl_2$ were flown in and the pressure was held at 200 mTorr, for example. The high frequency power of 13.56 MHz, for example, was fed with an electric field density of 2 $W/cm^2$. The material to be etched was an aluminum alloy which included 1% of silicon and 0.5% of copper, for example. The solid line 21 illustrates the temperature characteristic of the substrate 28 when the bottom electrode with polishing to a surface roughness of 1 $\mu m$ or less was used. Polishing to a surface roughness of 1 $\mu m$ or less were effected on both the aluminum portion 36 forming the bottom electrode and the anode oxide film 37. The solid line 22 illustrates the temperature characteristic of the substrate 28 when the aluminum portion 36 and the anode oxide film 37 of the bottom electrode both assumed a surface roughness of 4 $\mu m$. The dot line 23 illustrates the temperature characteristic of the substrate 28 when no finishing was effected on either the aluminum portion 36 or the anode oxide film 37 of the bottom electrode. It is noted that the surface roughness, when no finishing was effected, was approximately 10 $\mu m$ in terms of a sum of the surface roughnesses of the aluminum portion 36 and the anode oxide film 37.

The thickness of the anode oxide film was 62 $\mu m$, 61 $\mu m$ and 60 $\mu m$, respectively, when polishing of 1 $\mu m$, polishing of 4 $\mu m$ and no polishing were effected. Water of about 20° C. was fed as the refrigerant 27 from a constant temperature oven and circulated below the bottom electrode 24.

The etching apparatus implementing the present invention wherein the bottom electrode 24 was surface polished to 1 $\mu m$ as shown in FIG. 2 manifested 50° C. of temperature difference (the substrate up to 70° C.) 30 seconds after the etching process had started. Thereafter, the temperature difference was kept constant at 62° C. (the substrate up to 76° C.) for 180 seconds from the beginning of the etching process. On the other hand, where the apparatus included a conventional bottom electrode with no finishing treatment, the temperature never settled or stable in 180 seconds after the beginning of the etching process and the temperature difference amounted to 110° C. (the substrate up to 130° C.). In the case of the bottom electrode with surface finishing of 4 $\mu m$, temperature increase of the substrate 28 was suppressed as compared with the bottom electrode 24 with no finishing treatment, but much larger than the bottom electrode 28 with a surface roughness of 1 $\mu m$. These findings were believed to be derived from that the contact area of the bottom electrode with the substrate increased and thus heat transfer increased between the substrate 28 and the bottom electrode 24 by polishing the bottom electrode 24 to a surface roughness of 1 $\mu m$ or less.

The effect of the anode oxide film will be described as a second embodiment of the present invention, referring to the drawings.

Figure 3:
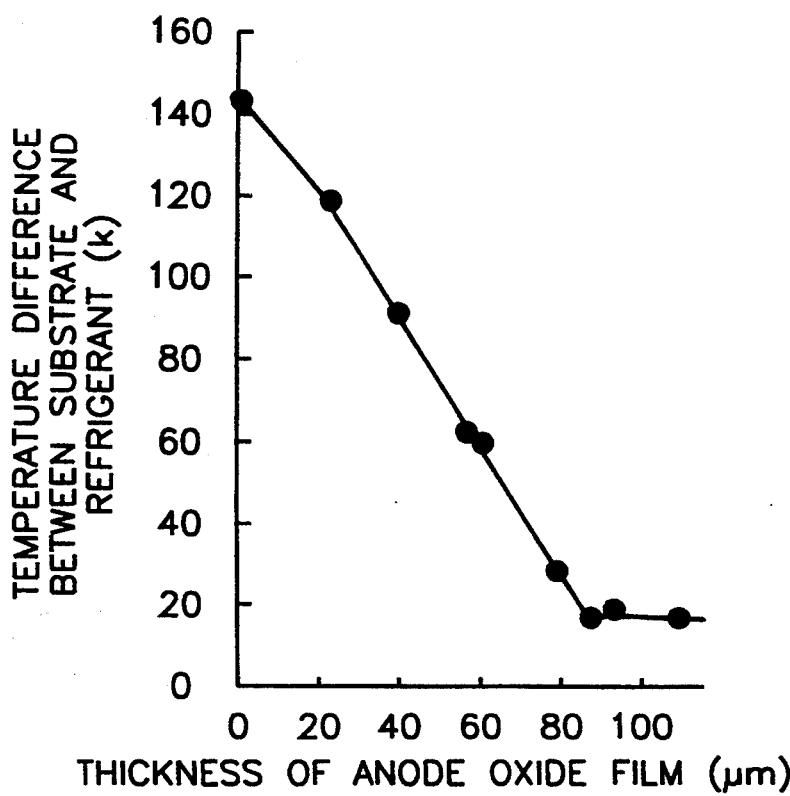
FIG. 3 is a chart showing the relationship between temperature difference between the refrigerant and substrate and the thickness of an anode oxide film.
Figure 4A:
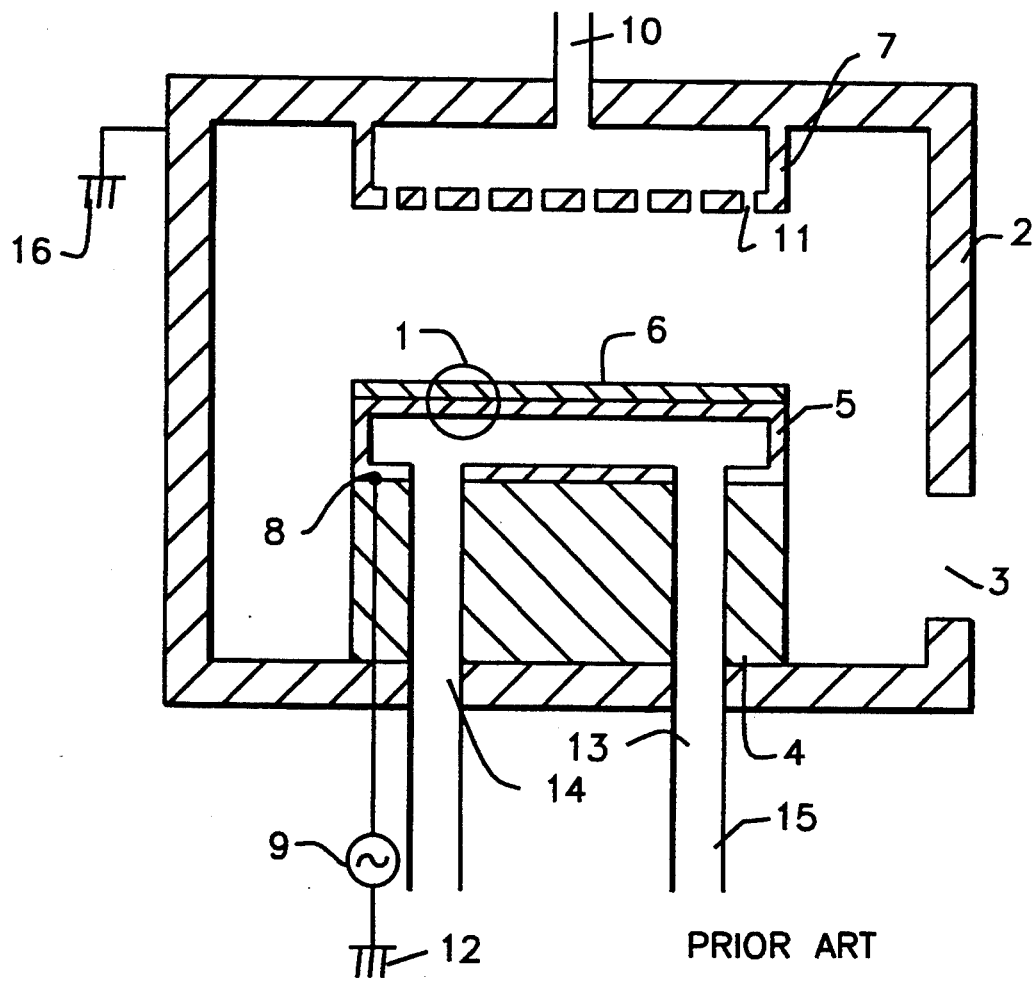
FIG. 4(a) is a cross sectional structure view of a conventional plasma etching apparatus.
Figure 4B:
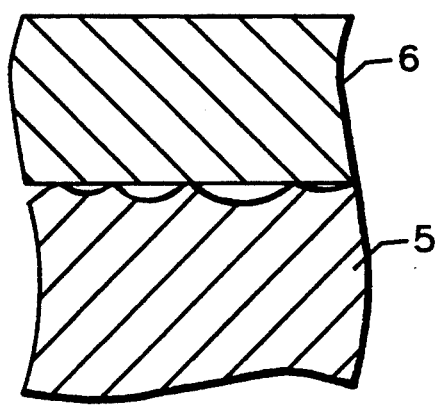
FIG. 4(b) is an enlarged view of a circle portion 1 in FIG. 4(a) showing a lower electrode and a substrate to be etched.

FIG. 3 illustrates the temperature difference between the refrigerant and the substrate 28 as a function of the thickness of the anode oxide film 17 when the substrate 28 was etched for 180 seconds. The scale of the ordinates and the etching conditions were identical with those in FIG. 2. It is noted that FIG. 3 shows the characteristic of the bottom electrode 24 with surface polishing to a surface roughness of 1 $\mu m$ or less. It is evident from FIG. 3 that the increase of the temperature difference was suppressed as the thickness of the anode oxide film increased. If the thickness of the anode oxide film was 90 $\mu m$ or more, the temperature difference was substantially constant on the order of 20° C. (the temperature of the substrate up to 40° C.). This is due to the findings that heat exchange is improved and enhanced as the thickness of the anode oxide film increases. The reason why the temperature rise becomes constant for more than a certain thickness of the anode oxide film 17 is the effect of thermal resistance of the bottom electrode 24 and the substrate 28. In other words, when the etching process proceeds, heat is accumulated on both the bottom electrode 24 and the substrate 28 due to the plasma. Under the circumstance, the bottom electrode 24 is constantly cooled with the electrode refrigerant 7. If a certain heat is supplied to the bottom electrode 24 from one side and another heat from the other side, then balancing can be seen at a point where the amount of those heats is equal. The balancing point is seen at a temperature difference of 20° C. in FIG. 3.

The thickness 0 of the anode oxide film implies the bottom electrode with no anode oxidation at all. Even in this case, the surface of the aluminum portion 36 was finished to a surface roughness of 1 $\mu m$ or less. In this case, the temperature difference with respect to the substrate 28 amounted to 140° C. (the temperature of the substrate up to 160° C.).

Provided that the surface roughness of the bottom electrode 24 is reduced to 1 $\mu m$ or less in this manner, the anode oxide film 37 isolates the bottom electrode 24 from the substrate 28 or the plasma. The substrate 28 which is electrostatically charged with descending cathode of the plasma is absorbed with electrostatic force. In other words, the substrate 28 is charged with descending cathode of the plasma and a potential difference appears between the substrate 28 and the anode oxide film 37 with intervention of the anode oxide film 37. The potential difference causes the substrate 28 to be electrostatically absorbed onto the surface of the bottom electrode 24. Once the substrate 28 has been absorbed onto the substrate 28 by electrostatic force, heat transfer between both is improved and stabilization is seen at a smaller temperature difference as compared with other surface finishing treatments.

The reason why the heat resistance and the temperature difference between the electrode refrigerant 7 and the substrate 28 become smaller with increase in the thickness of the anode oxide film is that the leak current of the anode oxide film becomes smaller with increase in the thickness of the anode oxide film. With a minimum of the leak current, the amount of the charges charged becomes larger and the effect of electrostatic absorption is enhanced.

The illustrated embodiment has proven to be effective in precise temperature control provided that the thickness of the anode oxide film is 90 $\mu m$ or more. For the anode oxidation technique, mother material, e.g., aluminum would start to melt the anode oxide film suffers from deterioration of film quality when the thickness of the film exceeds a certain limit. The upper limit of the thickness of the anode oxide film is 120 $\mu m$.

By using the above illustrated electrode structure of the plasma etching apparatus, the plasma is generated and desired etching is effected on the substrate. As soon as the etching process is over, the high frequency power is reduced gradually in power level. Then, the etching process is completed and closed.

Gradual reduction of the high frequency power is desirable because the substrate would be tightly secured or attached to the bottom electrode and difficulty would be experienced in removing the substrate as discussed with respect to the conventional electrostatic absorption technique in the description of the prior art, should the power supply be shut off completely immediately upon completion of the etching process. Gradual reduction of the high frequency power supplied as in the illustrated embodiment, therefore, allows the substrate to be removed smoothly from the bottom electrode.

As described hereinbefore, the plasma etching apparatus according to the present invention is simple in structure and capable of controlling the temperature of the substrate 28 with a very high degree of accuracy, without contact with the surface of the substrate to be etched. Consequently, if the etching apparatus designed according to the embodiments of the present invention is used in VLSI manufacturing processes, a very high accuracy of fine working may be achieved with improved production yield.

It is much easier to control the temperature of the substrate 28 by using an insulating film resulting from anode oxidation of aluminum. If alumina made by anode oxidation of aluminum is used, then it would not suffer from erosion even upon exposure to the etching atmosphere and reliability of the etching apparatus would be assured.

Moreover, in addition to the improvement of the etching performances, the illustrated embodiments may keep low the temperature of the substrate 28 by lowering the temperature of the electrode refrigerant, thereby enabling very low temperature etching which is believed to have excellent etching performances.

Although the two embodiments of the present invention have been described in the foregoing, the insulating film on which the substrate 28 is seated should not be limited to alumina and any other insulating film having good surface smoothness may be used. The etching conditions should also not be limited to those in the foregoing and other gases, pressure and power supply may be substituted therefor. Similarly, the substrate 28 to be etched should not be limited to those in the above illustrated embodiments.

The plasma etching apparatus of the present invention provides very accurate control over the temperature of the substrate and assures stable etching performances. Unlike the clamping technique which needs a wafer press, the present invention allows etching without contact between the surface of the substrate and other materials.

The foregoing description and the drawings are illustrative and are not to be taken as limiting. Still other variations and modifications are possible without departing from the spirit and scope of the present invention.

What is claimed is:

1. An electrode structure for plasma etching apparatus comprising:
    an electrically conductive portion having a surface roughness of 1 $\mu$m or less; and
    an anodic oxide film disposed on the electrically conductive portion by anodic oxidation of the electrically conductive portion, said anodic oxide film having a surface roughness of 1 $\mu$m or less, wherein a substrate to be etched is mounted on the anodic oxide film.

2. An electrode structure for plasma etching apparatus according to claim 1 wherein high frequency power is supplied to the electrically conductive portion.

3. An electrode structure for plasma etching apparatus according to claim 1 wherein the thickness of the anodic oxide film is in a range between 90 $\mu$m and 120 $\mu$m.

4. An electrode structure for plasma etching apparatus according to claim 3 wherein the electrically conductive portion is aluminum.

5. Plasma etching apparatus comprising:
    an electrically conductive portion to which high frequency power is supplied,
    a lower electrode having an anodic oxide film formed on the electrically conductive portion by anodic oxidation of the electrically conductive portion, said anodic oxide film holding thereon a substrate to be etched, and
    an upper electrode placed to face the lower electrode and grounded, wherein a refrigerant is introduced into the lower electrode from below to cool the substrate, and
    wherein the substrate is electrostatically absorbed onto the lower electrode and the difference between the temperature of the refrigerant in the lower electrode and the temperature of the substrate is kept constant below 20° C. when the high frequency power is supplied and etching process advances.

6. Plasma etching apparatus according to claim 5 wherein the surface roughness of the electrically conductive portion is 1 $\mu$m or less and the surface roughness of the anodic oxide film is 1 $\mu$m or less.

7. Plasma etching apparatus according to claim 6 wherein the thickness of the anodic oxide film is in a range between 90 $\mu$m and 120 $\mu$m.

8. Plasma etching apparatus according to claim 5 further comprising means for gradually reducing the high frequency power to make easy removal of the substrate electrostatically absorbed, from the lower electrode when etching process is completed.

* * * * *